United States Patent [19]
McMaster et al.

[11] Patent Number: 6,058,740
[45] Date of Patent: May 9, 2000

[54] GLASS SUBSTRATE DEPOSITION SYSTEM HAVING LATERAL ALIGNMENT MECHANISM

[75] Inventors: Alan J. McMaster, Dexter, Mich.; Harold A. McMaster, Perrysburg, Ohio

[73] Assignee: First Solar, LLC, Toledo, Ohio

[21] Appl. No.: 09/256,495

[22] Filed: Feb. 23, 1999

[51] Int. Cl.[7] .............................. C03C 17/00; C03B 9/40; C03B 23/20; C23C 14/00; C23C 16/00

[52] U.S. Cl. .............................. 65/60.1; 65/157; 65/323; 414/217; 118/50; 118/715; 118/730

[58] Field of Search .......................... 65/60.1, 157, 323; 118/50, 715, 725, 730; 414/217

[56] References Cited

U.S. PATENT DOCUMENTS

| | | |
|---|---|---|
| 3,607,200 | 9/1971 | McMaster et al. .................. 65/275 |
| 3,932,120 | 1/1976 | Sokolow ............................. 65/323 |
| 5,248,349 | 9/1993 | Foote et al. . |
| 5,372,646 | 12/1994 | Foote et al. . |
| 5,470,397 | 11/1995 | Foote et al. . |
| 5,536,333 | 7/1996 | Foote et al. . |
| 5,772,715 | 6/1998 | McMaster et al. . |

*Primary Examiner*—Stanley S. Silverman
*Assistant Examiner*—Jacqueline A Ruller
*Attorney, Agent, or Firm*—Brooks & Kushman P.C.

[57] ABSTRACT

A deposition system (20) for depositing a material layer on a glass sheet substrate includes a lateral alignment mechanism (28) for laterally aligning glass sheet substrates with an ingress seal (48) of a deposition station (22). The lateral alignment mechanism (28) includes a pair of banks (164, 166) of alignment members (168) spaced laterally with respect to each other along the direction of conveyance. Round alignment surfaces (170) of the alignment members (168) are located above conveyor rolls (96) upstream from the housing of the deposition station and are rotatable about associated vertical axes. A positioner (172) moves one of the banks of alignment members (168) laterally with respect to the direction of conveyance toward the other bank of alignment members to laterally align the glass sheet substrate along the direction of conveyance with the ingress seal assembly (48). A rotary drive (174) rotates the alignment members (168) to cooperate with the conveyor rolls in conveying the glass sheet substrate.

8 Claims, 7 Drawing Sheets

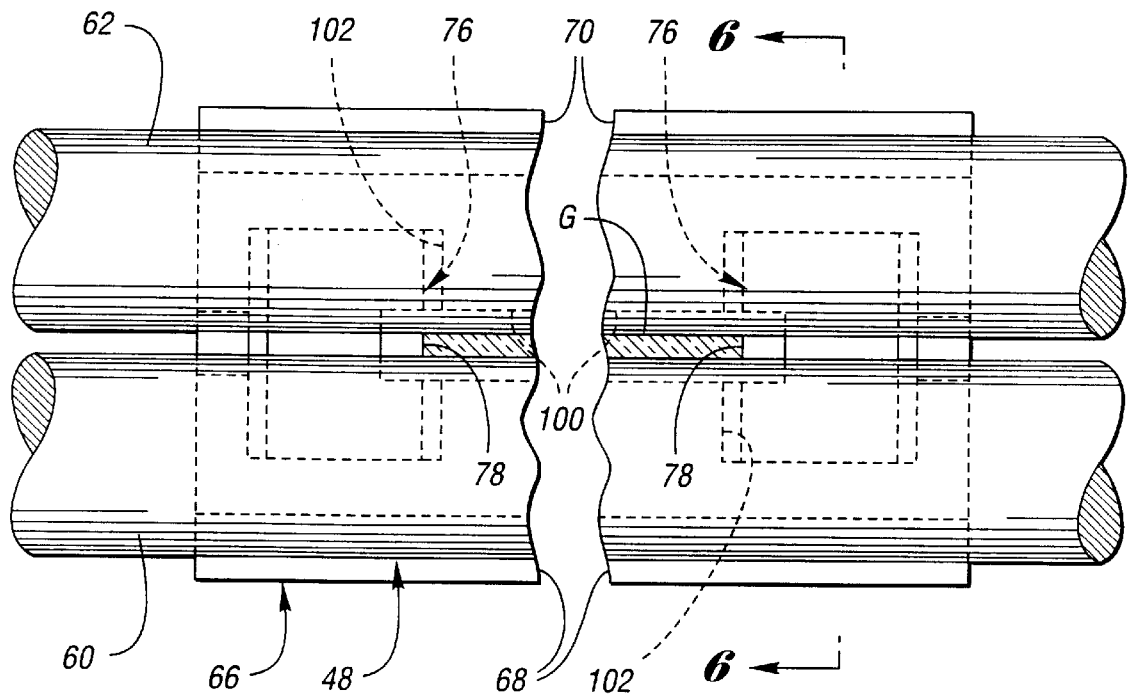
Fig. 5
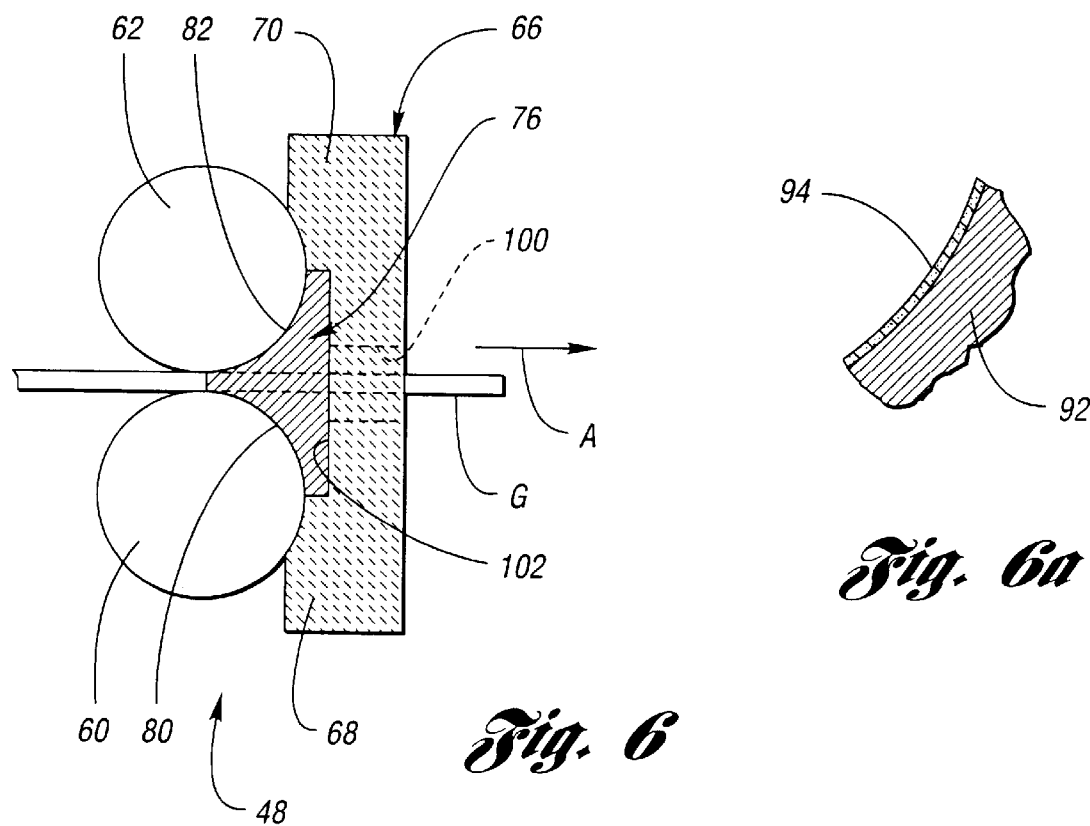
Fig. 6
Fig. 6a

GLASS SUBSTRATE DEPOSITION SYSTEM HAVING LATERAL ALIGNMENT MECHANISM

TECHNICAL FIELD

This invention relates to a glass sheet substrate deposition system having a lateral alignment mechanism.

BACKGROUND ART

Glass sheet deposition stations have previously utilized load lock seals for sealing a deposition chamber in which a material is deposited on the glass sheets such as disclosed by the U.S. Pat. Nos. 5,248,349 Foote et al.; 5,372,646 Foote et al.; 5,470,397 Foote et al.; and 5,536,333 Foote et al. In addition, glass sheet deposition stations have also included vacuum slit seals that permit the continuous introduction of glass sheets into a deposition chamber and exiting therefrom after the deposition as disclosed by the U.S. Pat. No. 5,772,715 McMaster et al. Such continuous entry and exit slit seals as disclosed by McMaster et al. have also previously included rolls that freely rotate against the lower and upper surface of the glass sheet to cooperate with the vacuum in sealing the slits through which the glass sheets are introduced into the deposition chamber for the deposition and from which the glass sheets exit the deposition chamber after the deposition.

DISCLOSURE OF INVENTION

An object of the present invention is to provide an improved deposition system for depositing a material layer on a glass sheet substrate.

In carrying out the above object, the deposition system includes a deposition station having a housing defining a vacuum chamber in which the deposition of the material layer is performed. The deposition station includes an ingress seal assembly and an egress seal assembly. A conveyor of the deposition station conveys the glass sheet substrate along a direction of conveyance at a line speed into the housing of the deposition station through the ingress seal assembly, through the vacuum chamber of the housing for the deposition of the material layer, and out of the housing through the egress seal assembly after the deposition of the material layer. The conveyor includes horizontal conveyor rolls located upstream from the housing. A lateral alignment mechanism of the deposition system is located upstream from the ingress seal assembly and includes a pair of banks of alignment members spaced laterally with respect to each other along the direction of conveyance. The alignment members of each bank are spaced along the direction of conveyance from each other and have round alignment surfaces located above the conveyor rolls and are rotatable about associated vertical axes. A positioner of the alignment mechanism moves one of the banks of alignment members laterally with respect to the direction of conveyance toward the other bank of alignment members to laterally align the glass sheet substrate along the direction of conveyance with the ingress seal assembly. A rotary drive of the lateral alignment mechanism rotates the alignment members along their associated vertical axes to cooperate with the conveyor rolls in conveying the glass sheet substrate at the line speed into the housing of the deposition station through the ingress seal assembly for the deposition within the vacuum chamber.

In the preferred construction, the alignment members of the lateral alignment mechanism are vertically extending spindles that project upwardly between the conveyor rolls from below the conveyor and have upper ends that define the round alignment surfaces.

The glass sheet substrate deposition station as disclosed includes a heating furnace located upstream from the deposition station, a slideway assembly that supports the pair of banks of alignment members externally of the heating surface with the alignment members projecting into the heating furnace to provide the alignment of the glass sheet substrate. The rotary drive is located externally of the heating furnace to provide the rotation of the alignment members. The vertically extending spindle that preferably embody the alignment members project upwardly from the slideway assembly and from the rotary drive into the heating furnace from below, and the vertically extending spindles have upper ends that define the round alignment surfaces.

The glass sheet substrate deposition system preferably includes a drive mechanism having a first rotary output for rotatively driving the conveyor rolls upstream of the furnace and having a second rotary output for rotatively driving the rotary drive for rotating the alignment members. The rotary drive for rotating the alignment members preferably includes a gear box having first and second rotary outputs for respectively rotatively driving the pair of banks of alignment members. Furthermore, the rotary drive preferably includes a pair of chains that respectively rotatively drive the pair of banks of alignment members from the first and second rotary outputs of the gear box.

BRIEF DESCRIPTION OF DRAWINGS

FIG. 5 is an enlarged broken away partial view of FIG. 3 to further illustrate the construction of the seal assemblies.

FIG. 6 is a sectional view taken along the direction of line 6—6 in FIG. 5 to illustrate the construction of side seals of the seal assemblies.

FIG. 6a is a view illustrating that the side seals can be made of coated stainless steel.

BEST MODE FOR CARRYING OUT THE INVENTION

Figure 1:
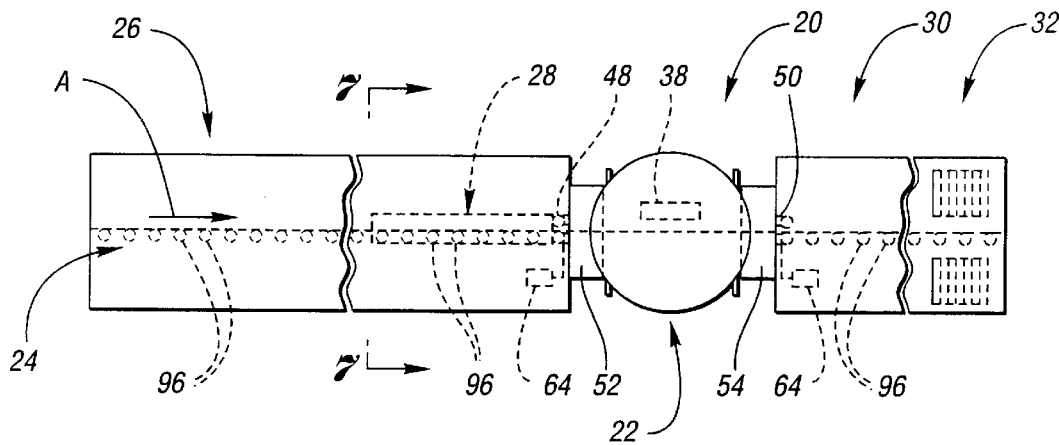
FIG. 1 is a side elevational view illustrating a glass sheet deposition system including a deposition station and a lateral alignment mechanism in accordance with the invention.

With reference to FIG. 1 of the drawings, a glass sheet substrate deposition system generally indicated by 20 includes a deposition station 22 that includes a conveyor 24 for conveying glass sheets through the system for the deposition. The conveyance is from the left toward the right along the direction of conveyance illustrated by arrow A. Deposition system 20 includes a furnace 26 in which the glass sheet substrates are heated for the deposition. At its right downstream end, the furnace 26 includes a lateral alignment mechanism 28 for providing alignment of the glass sheet substrates with the deposition station 22 as is hereinafter more fully described. After conveyance of the glass sheet substrates into the deposition station 22, through the deposition station for the deposition and then out of the deposition station, the processing is continued by passage through a downstream heated furnace 30 that eliminates any temperature differential along each glass sheet substrate until it has fully exited the deposition station 22. A cooling section 32 may also be provided for accelerating the cooling of the coated glass sheet substrates to handling temperature.

Figure 2:
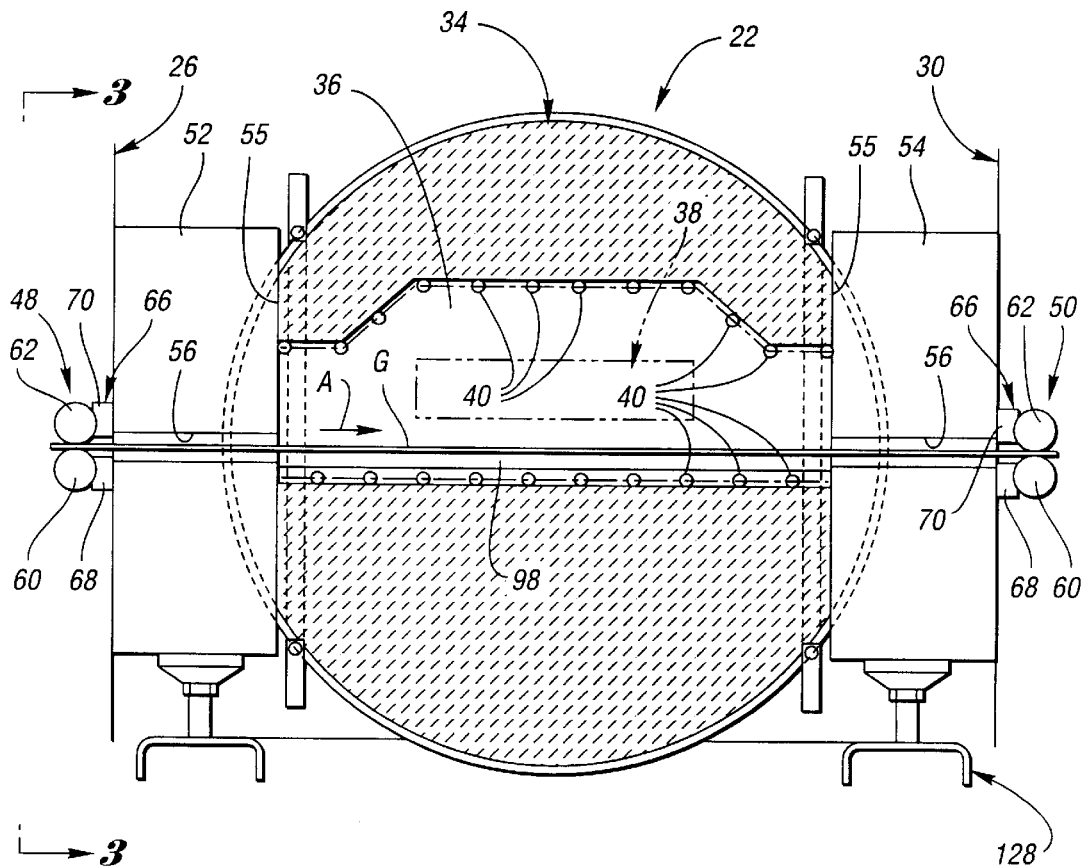
FIG. 2 is an enlarged view of the deposition station shown in FIG. 1, but taken partially in section to illustrate the vacuum chamber in which the deposition takes place.
Figure 3:
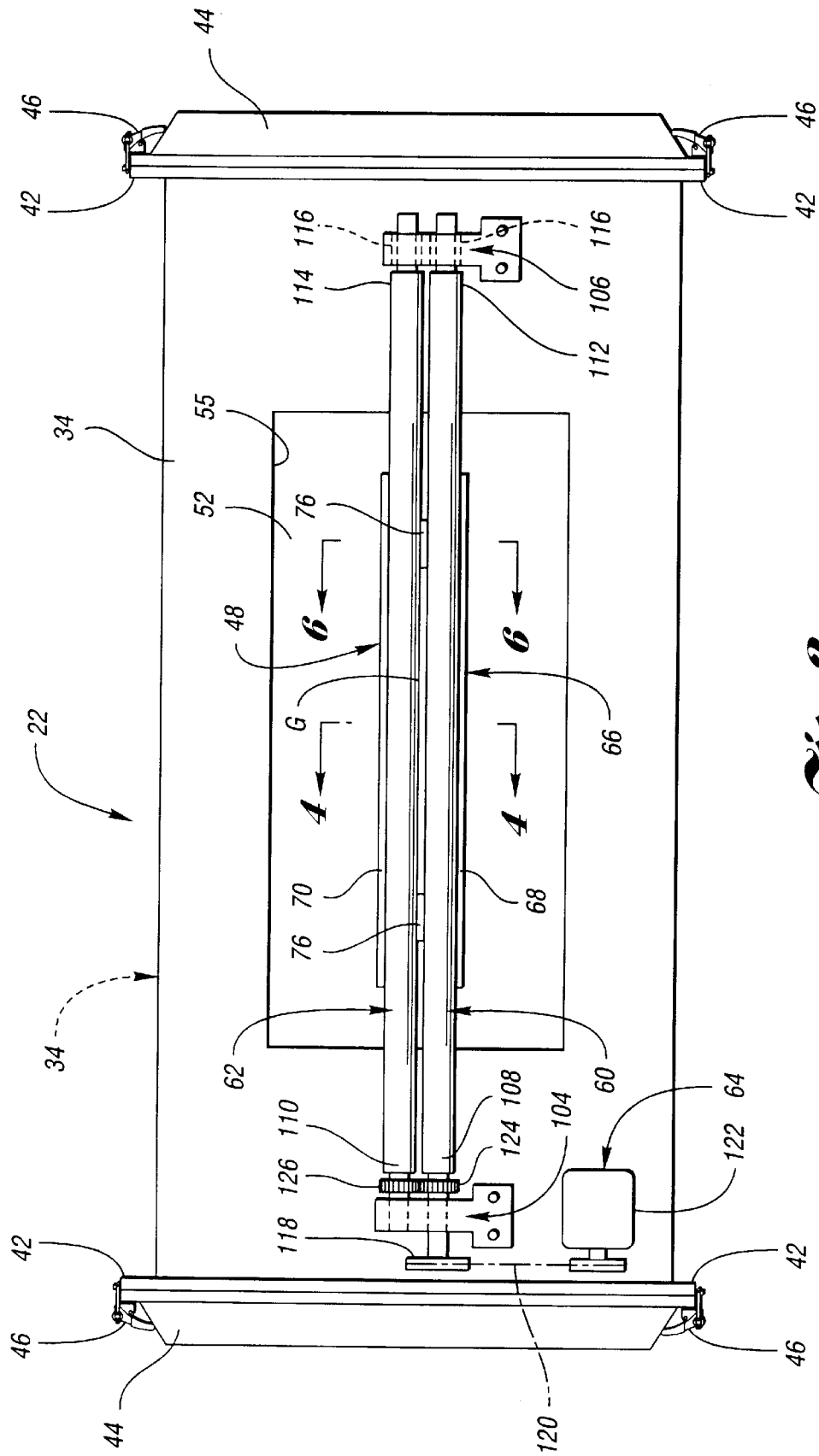
FIG. 3 is an elevational view taken along the direction of line 3—3 in FIG. 2 to illustrate the construction of an ingress seal assembly of the deposition station and is also illustrative of the construction of an egress seal assembly of the deposition station.

With reference to FIG. 2, the deposition station 22 is illustrated as including an insulated housing 34 that has a round tubular shape extending transversely with respect to the direction of conveyance A. The insulated housing 34 defines a vacuum chamber 36 in which any suitable type of deposition apparatus 38 is located to provide deposition on the glass sheet substrate which is identified by G. Heaters 40 within the vacuum chamber 36 provide heating thereof and may be constructed as electric resistance elements. As illustrated in FIG. 3, the insulated housing 34 has opposite lateral end flanges 42 of annular shape to which round end caps 44 are secured by clamps 46. Unclamping of the clamps 46 allows removal of the end caps 44 to provide access to the interior of the deposition station for any necessary maintenance.

Figure 4:
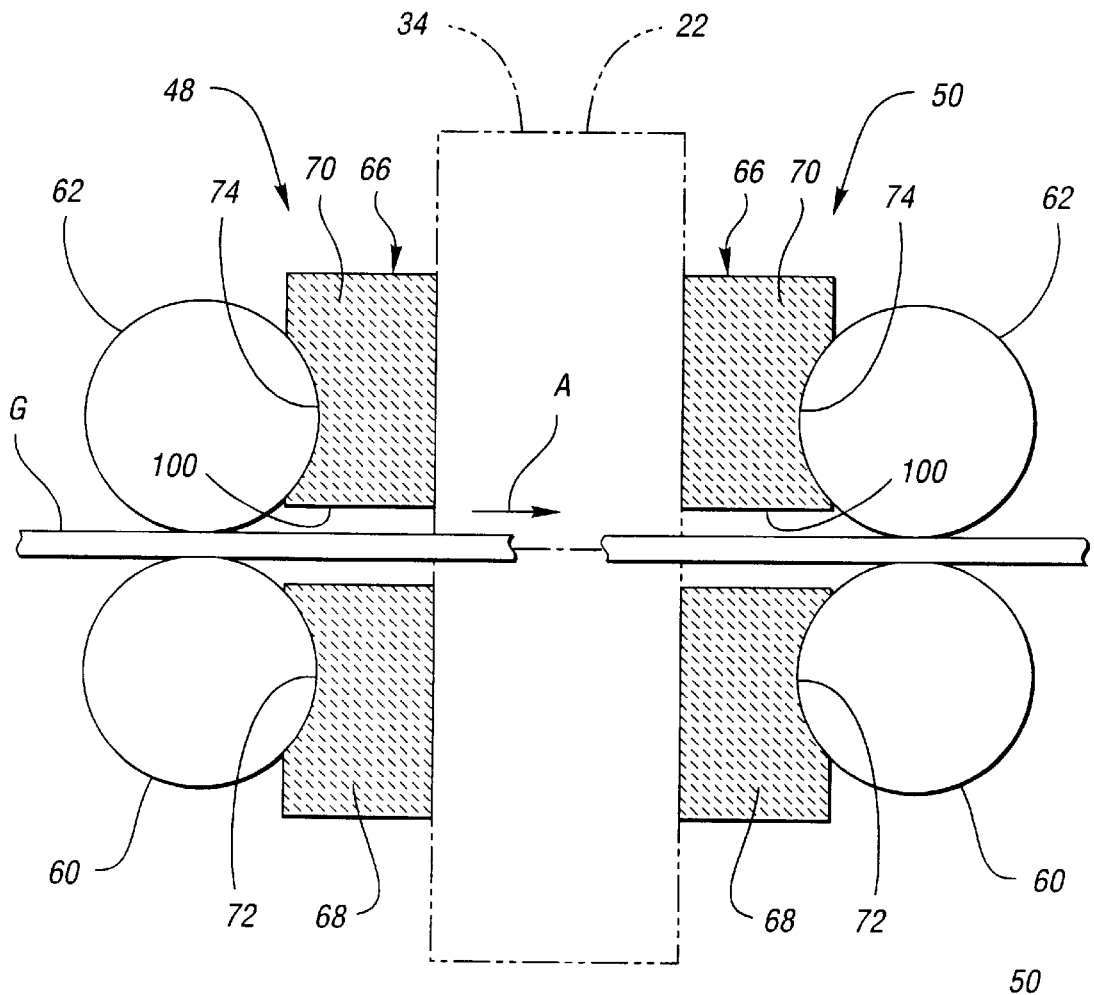
FIG. 4 is a sectional view taken along the direction of line 4—4 in FIG. 3 to further illustrate the construction of the ingress and egress seal assemblies.

With reference to FIG. 2, the deposition station 22 includes an ingress seal assembly 48 through which the glass sheet substrate is conveyed into the housing for the deposition within the vacuum chamber 36 and also includes an egress seal assembly 50 through which the glass sheet substrate is conveyed out of the housing after the deposition within the vacuum chamber. The ingress and egress seal assemblies 48 and 50 are respectively mounted on associated upstream and downstream seal blocks 52 and 54 that have associated slots 56 and 58 through which the glass sheet substrates G are conveyed upon passage into and out of the vacuum chamber 36. The seal blocks 52 and 54 are mounted within rectangular flat sections 55 in the generally annular shape of the furnace housing 34 as shown by combined reference to FIGS. 2 and 3. Each of the ingress and egress seal assemblies 48 and 50 includes lower and upper seal rolls 60 and 62 that rollingly engage the glass sheet substrate G from below and above to provide sealing thereof during the passage into or out of the vacuum chamber. The ingress and egress seal assemblies 48 and 50 as shown in FIGS. 1 and 3 each includes a drive mechanism 64 that rotatively drives the lower and upper seal rolls 60 and 62 thereof during the seal conveyance into and out of the vacuum chamber. A seal bearing 66 of each of the ingress and egress seal assemblies 48 and 50 is best illustrated in FIGS. 4 and 5 and includes lower and upper seal bearing portions 68 and 70 that respectively extend between the associated lower and upper seal rolls 60 and 62 and the associated seal block 52 or 54 of the housing and have curved surfaces 72 and 74 slidably engaged by the seal rolls to provide sealing and rotational support of the seal rolls. It should be noted that the vacuum within the vacuum chamber is communicated as shown in FIG. 2 through the seal block slots 56 and 58 with the lower and upper seal rolls 60 and 62 to pull them toward the glass sheet substrate G and the lower and upper seal bearing portions 68 and 70 to maintain the sealed relationship that maintains the vacuum within the vacuum chamber.

Each of the ingress and egress seal assemblies 48 and 50 shown in FIG. 2 also includes side seals 76 that are best illustrated in FIGS. 5 and 6. More specifically, the side seals 76 have inwardly facing side surfaces 78 for slidably engaging the opposite lateral sides of the glass sheet substrate G as shown in FIG. 5 and also have lower and upper curve surfaces 80 and 82 for slidably engaging the lower and upper seal rolls 60 and 62 as shown in FIG. 6 in order to provide complete sealing of the glass sheet substrate with the deposition station housing upon movement into or out of the deposition station through the seal assembly.

Figure 4A:
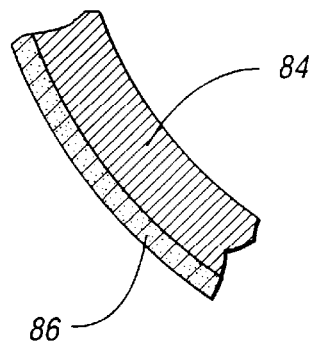
FIG. 4a illustrates that the construction of the seal rolls can be of stainless steel having a coating.
Figure 4B:
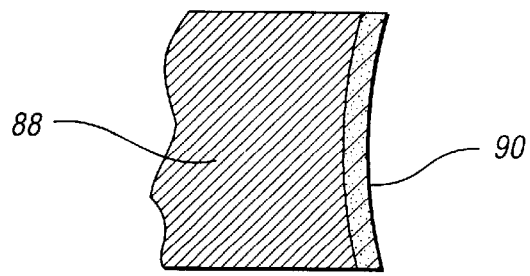
FIG. 4b illustrates that the construction of the seal bearing portions can be of a coated stainless steel.

Preferred materials for the seal assemblies 48 and 50 will now be described. As illustrated in FIG. 4a, each of the lower and upper seal rolls is preferably made from a stainless steel 84 having a high temperature coating 86 that can withstand heating while still having good lubricity for sliding over the associated lower or upper seal bearing portion 68 or 70 and for rollingly engaging the glass sheet substrate G. Furthermore, the lower and upper seal bearing portions 68 and 70 can be made of graphite as illustrated in FIG. 4 or can be made of stainless steel 88 with a high temperature coating 90 as illustrated in FIG. 4b so as to have resistance to high temperature while still having good lubricity to withstand the sliding interface with the associated lower or upper seal roll 60 or 62. Likewise, the side seals 76 also can be made of graphite as shown in FIG. 6 or of stainless steel 92 with a high temperature coating 94 as shown in FIG. 6a, and either construction will have resistance to high temperature and good lubricity in slidably engaging the lower and upper seal rolls 60 and 62 and also slidably engaging the lateral edges of the glass sheet substrate G.

As illustrated in FIG. 1, the conveyor that conveys the glass sheet substrates G through the system 20 includes horizontal conveyor rolls 96 located upstream and downstream from the deposition station 22. In addition, as illustrated in FIG. 2, the conveyor 24 also includes a slide plate 98 located within the vacuum chamber 36 to provide support of each glass sheet substrate G during conveyance through the vacuum chamber for the deposition by the deposition apparatus 38. This slide plate 98 is most preferably made of graphite so as to have resistance to high temperatures as well as having good lubricity for slidably supporting the glass sheet substrate.

As illustrated in FIGS. 5 and 6, each seal bearing 66 preferably has its lower and upper seal bearing portions 68 and 70 unitary with each other and defining a slot 100 through which the glass sheet substrates pass. At the opposite lateral ends of the slot 100, the outer surface of the seal bearing 66 includes depressions 102 that receive the side seals 76 as shown in FIG. 6. The slot 100 has a greater length than the lateral width of the glass sheet substrate and the depressions 102 have a lateral width greater than the lateral width of the side seal 76 and are positioned so as to allow movement of the side seals laterally with respect to the direction of conveyance in order to maintain the slidably engaged relationship of their side surfaces 78 with the glass sheet substrate under the impetus of the vacuum within the vacuum chamber.

The ingress and egress seal assemblies 48 and 50 and their drive mechanisms 64 are further illustrated in FIG. 3 which specifically shows the ingress seal assembly. More specifically, each of the seal assemblies includes first and second laterally spaced bearings 104 and 106 that rotatively support the lower and upper seal rolls 60 and 62 in cooperation with the rotational support thereof by the seal bearing 66 and its lower and upper seal bearing portions 68 and 70 as previously described. More specifically, the lower and upper seal rolls 60 and 62 of each seal assembly have a first set of adjacent ends 108 and 110 rotatively supported by the first bearing 104 and driven by the drive mechanism 64. Furthermore, the lower and upper seal rolls 60 and 62 of each seal assembly have a second set of ends 112 and 114 that are rotatively supported by the second bearing 106, which includes sleeve bearing portions 116 for permitting thermal expansion and contraction of the lower and upper seal rolls upon heating and cooling. Furthermore, each lower seal roll 60 of each seal roll assembly has its first end 108 including a drive member embodied by a pulley 118 directly rotatively driven by the drive mechanism 64 by a drive belt 120 that is rotatively driven by the rotary output of an electric motor drive 122. The first ends 108 and 110 of the lower and upper seal rolls 60 and 62 of each seal assembly also have meshed synchronizing gears 124 and 126 that rotatively drive the upper seal roll with the lower seal roll. The drive mechanism 64 is electronically synchronized in any suitable manner with the conveyor 24 illustrated in FIG. 1 for conveying the glass sheet substrate through the deposition system so as to provide the proper speed of drive.

Figure 7:
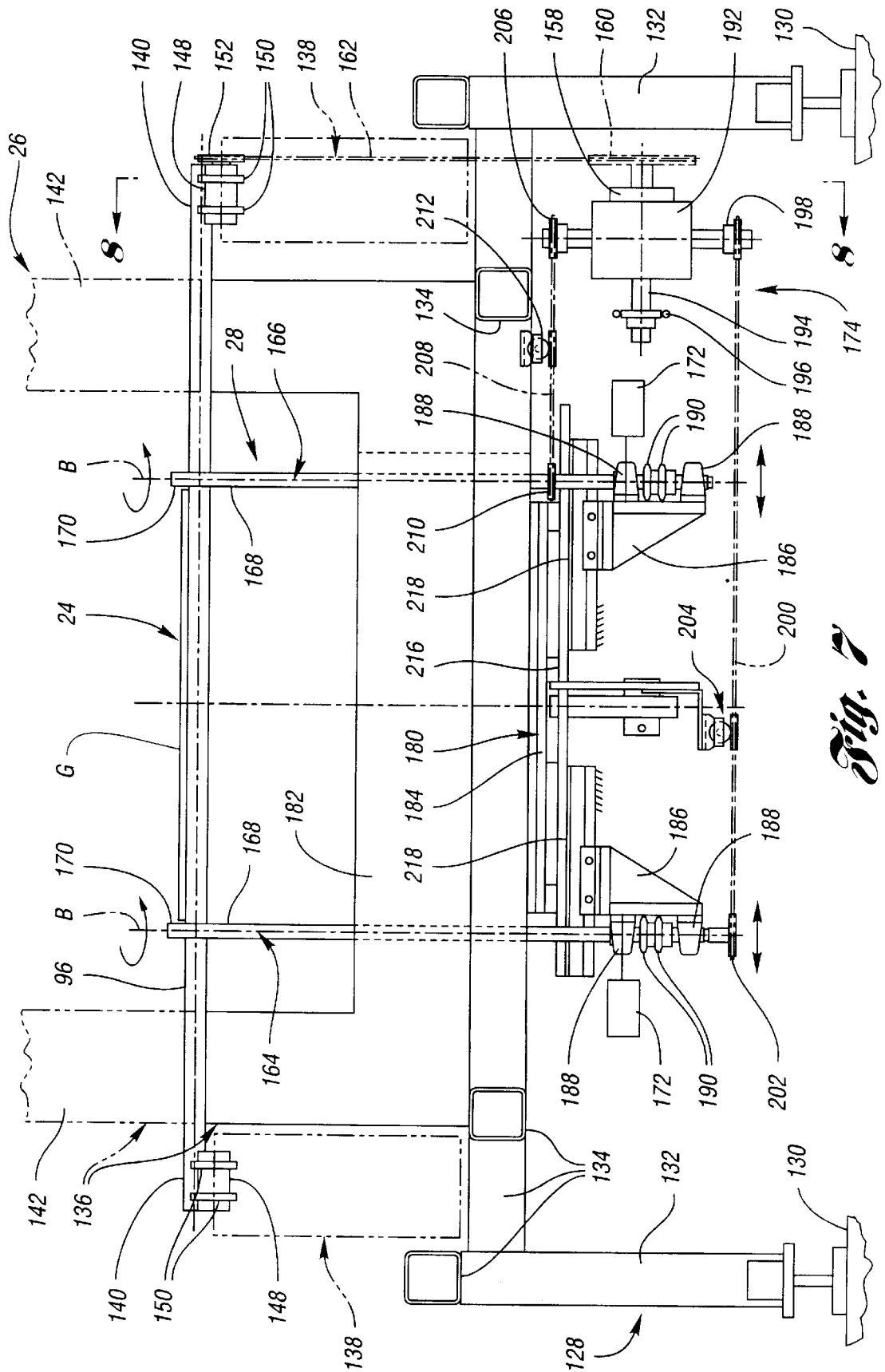
FIG. 7 is a cross sectional view taken through the deposition system along the direction of line 7—7 in FIG. 1 to illustrate the lateral alignment mechanism which aligns glass sheet substrates with the ingress seal assembly prior to conveyance thereof into the vacuum chamber for the deposition.
Figure 8:
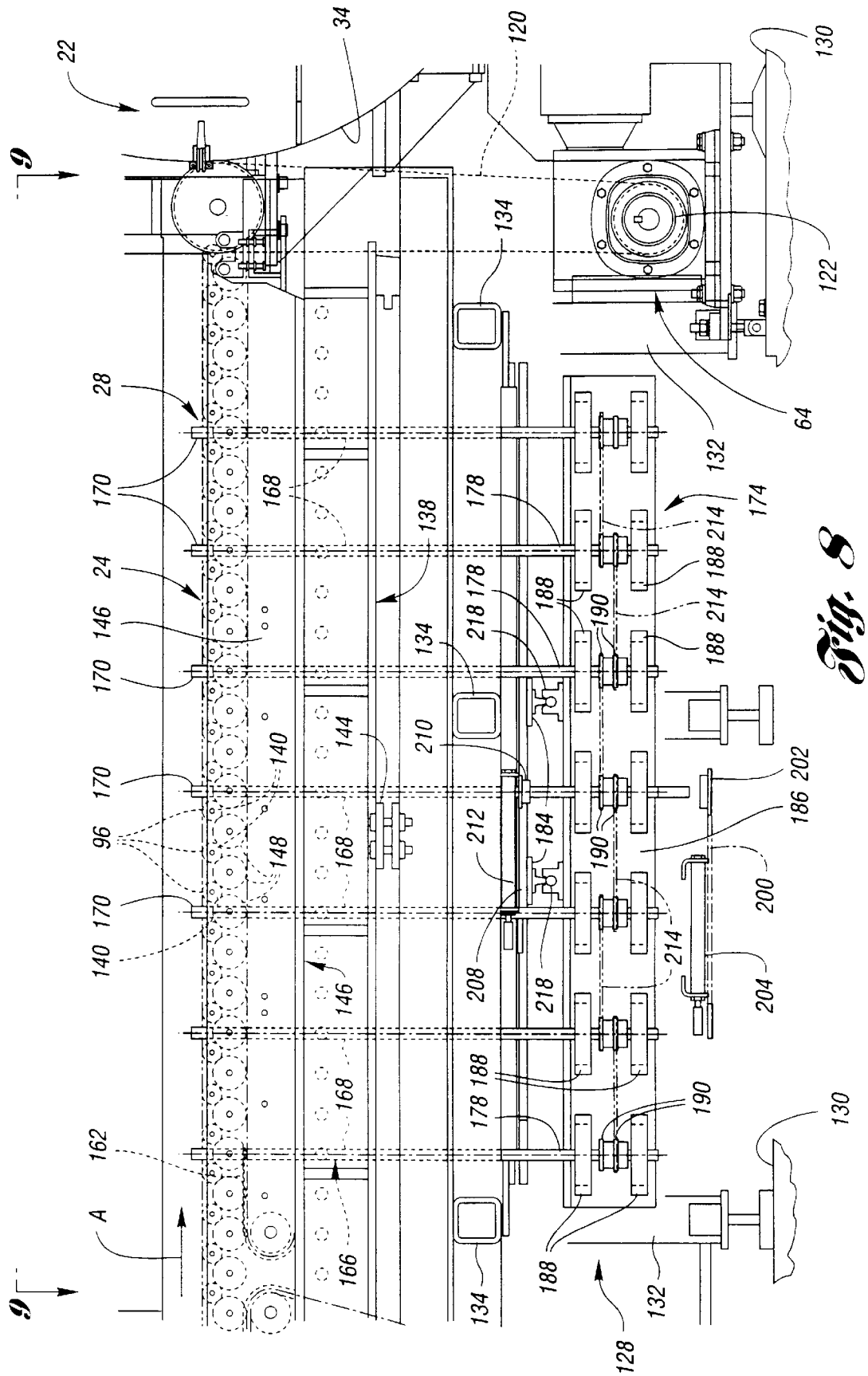
FIG. 8 is a side elevational view taken along the direction of line 8—8 in FIG. 7 to further illustrate the construction of the lateral alignment mechanism.

With reference to FIGS. 7 and 8, the furnace 26 upstream from the deposition station includes a support framework 128 mounted on the factory floor 130 and including vertical posts 132 and horizontal beams 134 that support an insulated housing 136 of the furnace. At each of its lateral sides, the furnace housing 136 has a roll support assembly 138 for rotatably supporting the conveyor rolls 96 whose opposite ends 140 (FIG. 7) extend outwardly through openings in side walls 142 of the housing. The conveyor rolls 96 are most preferably made as sinter bonded fused silica particles so as to have a low coefficient of thermal expansion. The roll support assemblies 138, as illustrated in FIG. 8, include adjustable mounts 144 for mounting roll supports 146 on the framework 128. Each roll support 146 rotatably mounts a plurality of spaced sprocket rolls 148 that have O-rings 150 as shown in FIG. 7, and the ends of the conveyor rolls 96 rest on these O-rings between adjacent sprocket rolls 148 as illustrated in FIG. 8. Each right sprocket roll 148 as shown in FIG. 7 also includes a drive sprocket 152. Also, the conveyor rolls are constrained at their ends in any suitable manner to prevent lateral movement with respect to the direction of conveyance.

Figure 9:
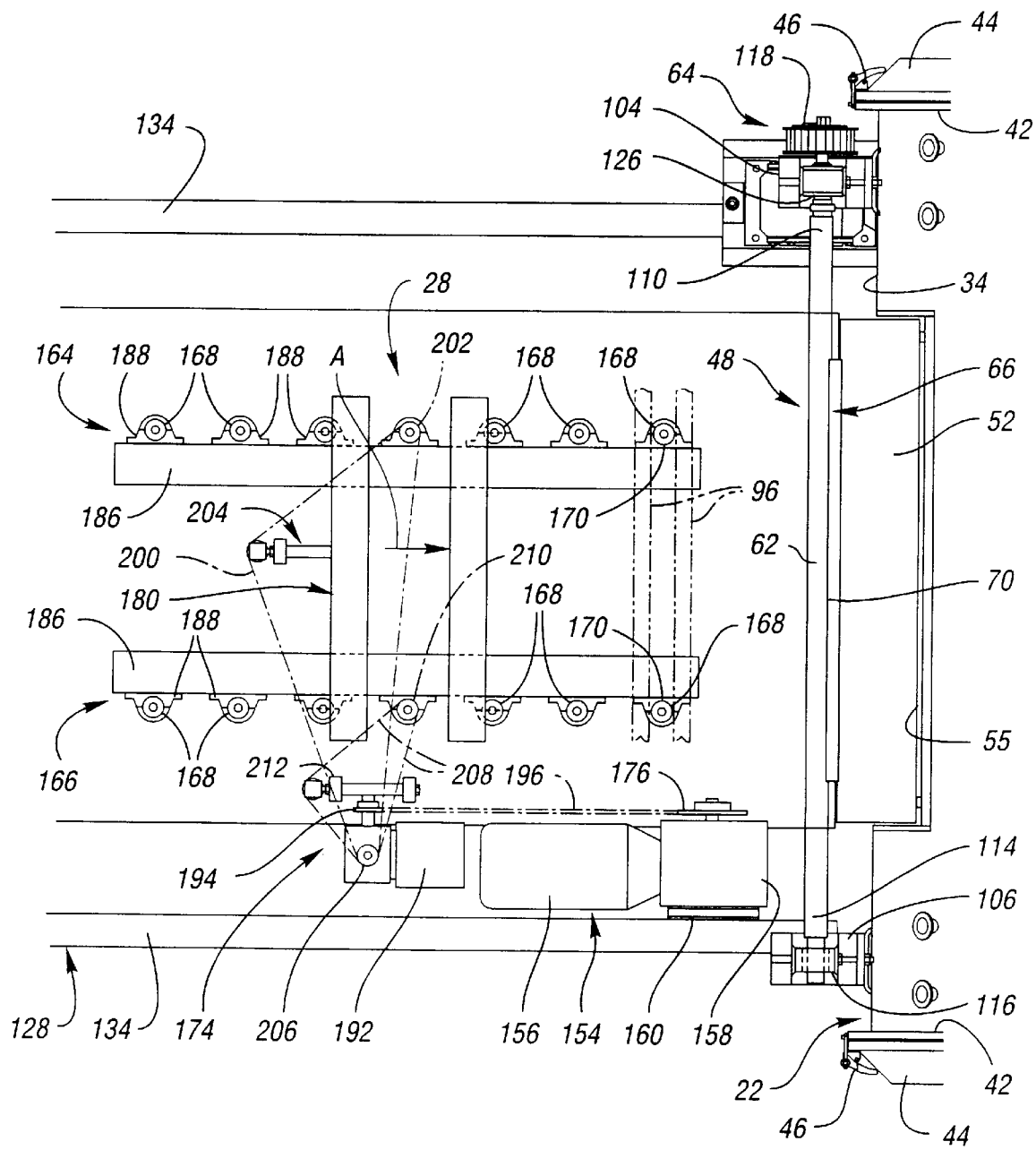
FIG. 9 is a top plan view taken along the direction of line 9—9 in FIG. 8 to further illustrate the construction of the lateral alignment mechanism.

As illustrated in FIG. 9, a drive mechanism 154 of the conveyor includes an electric drive motor 156 that drives a dual output gear box 158 whose one output 160 drives a chain 162 which, as shown in FIG. 7, rotatively drives the drive sprockets 152 of the sprocket rolls 148 so as to thereby rotatively drive the conveyor rolls 96 supported thereby as previously described. The conveyor conveys the glass sheet substrate along the direction of conveyance A at a line speed.

The lateral alignment mechanism 28 of the system is located as shown in FIG. 9 upstream from the ingress seal assembly 48 and includes banks 164 and 166 of alignment members 168 spaced laterally with respect to each other along the direction of conveyance. The alignment members 168 of each bank 164 and 166 are spaced along the direction of conveyance from each other and have round alignment surfaces 170 located above the conveyor rolls and rotatable about associated vertical axes B as shown in FIG. 7. Positioners 172 which may be embodied by hydraulic or pneumatic cylinders move the banks 164 and 166 of alignment members 168 laterally with respect to the direction of conveyance. For any given production run of glass sheet substrates of a given width, one of the positioners 172 will normally locate the associated bank 164 or 166 of alignment members 168 in a fixed position while the other bank of alignment members 168 will be cyclically moved toward the other bank to provide lateral alignment of each glass sheet substrate with the ingress seal. A rotary drive generally indicated by 174 rotatively drives the alignment members 168 about their associated vertical axes B to cooperate with the conveyor rolls in conveying the glass sheet substrate at the line speed into the housing of the deposition station through the ingress seal assembly for deposition within the vacuum chamber as previously described. The driving of the rotary drive 174 is by a second rotary output 176 of the gear box 158 of drive mechanism 154 shown in FIG. 9 as is hereinafter more fully described.

As best illustrated in FIGS. 7 and 8, the alignment members 168 preferably are constructed as vertically extending spindles that project upwardly between the conveyor rolls 96 from below the conveyor 24 and have upper ends that define the round alignment surfaces 170. Furthermore, these rotary spindles that provide the alignment members have lower ends that are rotatably supported by a slideway assembly 180 that is located below the furnace housing floor 182 supported by the framework 128. More specifically, the framework 128 supports a slideway member 184 on which a pair of laterally spaced slides 186 are laterally movable under the control of the associated positioners 172. Each slide 186 as shown in FIG. 8 includes sets of vertically spaced bearings 188 that rotatively support the lower ends 178 of the spindles that embody the alignment members 168. Between the vertically spaced bearings 188, the lower end 178 of each alignment member includes a pair of vertically spaced sprockets 190.

As shown in FIG. 9, the rotary drive 174 includes a gear box 192 having an input 194 driven by a chain 196 from the second output 176 of the gear box 158 of drive mechanism 154. The gear box 192 has a first rotary output 198 (FIG. 7) embodied by a sprocket that drives a chain 200 which drives an input sprocket 202 of the first bank 164 of alignment members 168. An idling tensioning sprocket assembly 204 shown in FIGS. 7 and 8 maintains the tension in the chain 200 when the lateral positioning of the bank 164 of alignment members 168 is adjusted under the operation of the associated positioner 172 shown in FIG. 7. The gear box 192 also has a second rotary output 206 (FIG. 7) that drives a chain 208 which drives an input sprocket 210 of the second bank 166 of alignment members 168. A tensioning sprocket assembly 212 maintains the tensioning of the drive chain 202 upon adjustment of the lateral positioning of the second bank 166 of alignment members 168 under the operation of the associated positioner 172 shown in FIG. 7. Both of the banks 164 and 166 of alignment members 168 as illustrated in FIG. 8 have drive chains 214 that extend alternately between the lower and upper sprockets 190 of adjacent pairs of the alignment members between the bearings 188 as shown in FIG. 8 such that the driving of the associated input sprocket through the associated drive chain as described above rotates all of the alignment members.

Since both the conveyor rolls 96 and the alignment members 168 are driven by the same drive mechanism 154 illustrated in FIG. 9, the rotational speed of the conveyor rolls and the alignment members is mechanically coupled, and the round alignment surfaces 170 of the alignment members are machined to the appropriate diameter to provide a surface speed matching that of the conveyor rolls 96.

As best illustrated in FIG. 7, the slideway assembly 184 has its slideway member 184 supported in any suitable manner on the framework 128 and has opposite lateral ends that support slideways 218 for respectively slidably supporting the pair of slides 186 on which the banks 164 and 166 of alignment members 168 are mounted for the rotational movement under the driving operation of the rotary drive 174 described above.

While the best mode for carrying out the invention has been described in detail, those familiar with the art to which this invention relates will recognize various other ways for practicing the invention as defined by the following claims.

What is claimed is:

1. A deposition system for depositing a material layer on a glass sheet substrate, comprising:

a deposition station including a housing defining a vacuum chamber in which deposition of the material layer is performed, and the deposition station including an ingress seal assembly and an egress seal assembly;

a conveyor for conveying the glass sheet substrate along a direction of conveyance at a line speed into the housing of the deposition station through the ingress seal assembly, through the vacuum chamber of the housing for the deposition of the material layer, and out of the housing through the egress seal assembly after the deposition of the material layer, and the conveyor including horizontal conveyor rolls located upstream from the housing; and a lateral alignment mechanism located upstream from the ingress seal assembly and including a pair of banks of alignment members spaced laterally with respect to each other along the direction of conveyance, the alignment members of each bank being spaced along the direction of conveyance from each other and having round alignment surfaces located above the conveyor rolls and being rotatable about associated vertical axes, a positioner for moving one of the banks of alignment members laterally with respect to the direction of conveyance toward the other bank of alignment members to laterally align the glass sheet substrate along the direction of conveyance with the ingress seal assembly, and a rotary drive for rotating the alignment members about their associated vertical axes to cooperate with the conveyor rolls in conveying the glass sheet substrate at the line speed into the housing of the deposition station through the ingress seal assembly for the deposition within the vacuum chamber.

2. A glass sheet substrate deposition system as in claim 1 wherein the alignment members comprise vertically extending spindles that project upwardly between the conveyor rolls from below the conveyor and have upper ends that define the round alignment surfaces.

3. A glass sheet substrate deposition system as in claim 1 further including a heating furnace located upstream from the deposition station, a slideway assembly that supports the pair of banks of alignment members externally of the heating furnace with the alignment members projecting into the heating furnace to provide the alignment of the glass sheet substrate, and the rotary drive being located externally of the heating furnace to provide the rotation of the alignment members.

4. A glass sheet substrate deposition system as in claim 3 wherein the alignment members comprise vertically extending spindles that project upwardly from the slideway assembly and from the rotary drive into the heating furnace from below, and the vertically extending spindles having upper ends that define the round alignment surfaces.

5. A glass sheet substrate deposition system as in claim 1 which includes a drive mechanism having a first rotary output for rotatively driving the conveyor rolls upstream of the furnace and having a second rotary output for rotatively driving the rotary drive for rotating the alignment members.

6. A glass sheet substrate deposition system as in claim 1 wherein the rotary drive for rotating the alignment members includes a gear box having first and second rotary outputs for respectively rotatively driving the pair of banks of alignment members.

7. A glass sheet substrate deposition system as in claim 6 wherein the rotary drive includes a pair of chains that respectively rotatively drive the pair of banks of alignment members from the first and second rotary outputs of the gear box.

8. A deposition system for depositing a material layer on a glass sheet substrate, comprising:

a deposition station including a housing defining a vacuum chamber in which deposition of the material layer is performed, and the deposition station including an ingress seal assembly and an egress seal assembly;

a conveyor for conveying the glass sheet substrate along a direction of conveyance at a line speed into the housing of the deposition station through the ingress seal assembly, through the vacuum chamber of the housing for the deposition of the material layer, and out of the housing through the egress seal assembly after the deposition of the material layer, and the conveyor including horizontal conveyor rolls located upstream from the housing;

a lateral alignment mechanism located upstream from the ingress seal assembly and including a pair of banks of alignment members spaced laterally with respect to each other along the direction of conveyance, the alignment members of each bank being spaced along the direction of conveyance from each other and having round alignment surfaces located above the conveyor rolls and being rotatable about associated vertical axes, a positioner for moving one of the banks of alignment members laterally with respect to the direction of conveyance toward the other bank of alignment members to laterally align the glass sheet substrate along the direction of conveyance with the ingress seal assembly;

a drive mechanism having first and second rotary outputs, the first rotary output rotatively driving the rolls of the conveyor upstream from the housing; and a rotary drive rotatively driven by the second output of the drive mechanism and rotatively driving the alignment members about their associated vertical axes to cooperate with the conveyor rolls in conveying the glass sheet substrate at the line speed into the housing of the deposition station through the ingress seal assembly for the deposition within the vacuum chamber.

* * * * *